United States Patent
Nozawa

(10) Patent No.: US 8,268,515 B2
(45) Date of Patent: Sep. 18, 2012

(54) MASK BLANK AND METHOD OF MANUFACTURING A TRANSFER MASK

(75) Inventor: Osamu Nozawa, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 377 days.

(21) Appl. No.: 12/567,515

(22) Filed: Sep. 25, 2009

(65) Prior Publication Data

US 2010/0081066 A1 Apr. 1, 2010

(30) Foreign Application Priority Data

Sep. 27, 2008 (JP) ................................ 2008-249338

(51) Int. Cl.
*G03F 1/20* (2012.01)
(52) U.S. Cl. .............................. 430/5; 430/296; 430/942
(58) Field of Classification Search .............. 430/5, 296, 430/942
See application file for complete search history.

(56) References Cited

U.S. PATENT DOCUMENTS

| 7,314,690 | B2 | 1/2008 | Okubo et al. |
| 7,371,484 | B2 | 5/2008 | Lee et al. |
| 7,709,161 | B2 | 5/2010 | Okubo et al. |

FOREIGN PATENT DOCUMENTS

| JP | 5053290 A | 3/1993 |
| JP | 2005-62884 A | 3/2005 |
| JP | 2009080510 A | 4/2009 |
| KR | 1020050019210 A | 3/2005 |
| KR | 1020080078789 A | 8/2008 |

OTHER PUBLICATIONS

Korean Office Action corresponding to Korean Patent Application No. 10-2009-0090889, dated Mar. 29, 2011.

*Primary Examiner* — Christopher Young
(74) *Attorney, Agent, or Firm* — Sughrue Mion, PLLC

(57) ABSTRACT

A mask blank having, on a light-transmissive substrate, a light-shielding film made of a material mainly containing chromium, and adapted to use a resist film for electron beam writing when forming a transfer pattern in the light-shielding film. In the mask blank, an etching mask film made of a material containing a nitride or oxynitride of silicon is formed on an upper surface of the light-shielding film and a conductive mask film made of a conductive material dry-etchable with a fluorine-based gas and a mixed gas of chlorine and oxygen is formed on an upper surface of the etching mask film.

16 Claims, 4 Drawing Sheets

MASK BLANK AND METHOD OF MANUFACTURING A TRANSFER MASK

This application is based upon and claims the benefit of priority from Japanese Patent Application No. 2008-249338, filed on Sep. 27, 2008, the disclosure of which is incorporated herein in its entirety by reference.

TECHNICAL FIELD

This invention relates to a transfer mask for use in transferring a fine pattern in the manufacture of a semiconductor device and further relates to a mask blank being a base of such a transfer mask.

BACKGROUND ART

Generally, fine pattern formation is carried out by photolithography in the manufacture of a semiconductor device. A number of substrates called photomasks (transfer masks) are normally used for such fine pattern formation. The photomask comprises generally a light-transmissive glass substrate having thereon a light-shielding fine pattern in the form of a metal thin film or the like and the photolithography is used also in the manufacture of the photomask.

In the manufacture of a photomask by photolithography, use is made of a mask blank having a light-shielding film on a light-transmissive substrate such as a glass substrate. The manufacture of the photomask using the mask blank comprises a writing process of writing a required pattern on a resist film formed on the mask blank, a developing process of developing the resist film to form a resist pattern in accordance with the written pattern, an etching process of etching the light-shielding film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the light-shielding film, where the resist pattern is not formed, is dissolved by dry etching or wet etching, thereby forming a required mask pattern (light-shielding film pattern) on the light-transmissive substrate. In this manner, the photomask is produced.

In order to miniaturize a pattern of a semiconductor device, it is necessary to shorten the wavelength of exposure light for use in photolithography in addition to miniaturization of the mask pattern of the photomask. In recent years, the wavelength of exposure light for use in the manufacture of a semiconductor device has been shortened from KrF excimer laser light (wavelength: 248 nm) to ArF excimer laser light (wavelength: 193 nm).

On the other hand, with respect to the photomask and the mask blank, the miniaturization of the mask pattern of the photomask requires a reduction in thickness of the resist film formed on the mask blank and dry etching as a patterning technique in the manufacture of the photomask.

However, the reduction in thickness of the resist film and the dry etching have the following technical problems.

One problem is that the processing time of the light-shielding film exists as one serious restriction to the reduction in thickness of the resist film on the mask blank. Chromium is generally used as a material of the light-shielding film and, in dry etching of chromium, a mixed gas of chlorine gas and oxygen gas is used as an etching gas. When patterning the light-shielding film by dry etching using the resist pattern as a mask, since the resist film is an organic film mainly composed of carbon, it is very weak against an oxygen plasma forming a dry etching environment. While patterning the light-shielding film by dry etching, the resist pattern formed on the light-shielding film should remain with a sufficient thickness. As one index, in order to make excellent the sectional shape of the mask pattern, the resist film is required to have a thickness that still remains even when the etching time is about twice a just etching time (100% overetching). For example, since, in general, the etching selectivity of chromium as the material of the light-shielding film to the resist film is 1 or less, the thickness of the resist film is required to be twice or more that of the light-shielding film. Although, naturally, the reduction in thickness of the resist film is desirable for achieving improvement in pattern CD accuracy, there is a limitation thereto for the reason described above.

Following the miniaturization of circuit patterns in recent years, however, a requirement to the photomask CD accuracy is becoming more strict. As the integration of semiconductor integrated circuits increases, the design rule in the manufacture of semiconductor integrated circuits becomes stricter and, in particular, a requirement to the photomask CD uniformity and CD linearity is becoming much stricter. Further, following the miniaturization of circuit patterns, there arises a problem that diffraction of exposure light deforms a transfer pattern to degrade pattern resolution and, as a solving means therefor, use is often made of the optical proximity correction (OPC) technique that predicts deformation of a transfer pattern by simulation in advance and corrects it. According to this OPC technique, the deformation of the transfer pattern is suppressed by providing the transfer pattern with a finer auxiliary pattern and therefore a resist pattern becomes still finer. Consequently, there arises a problem that the ratio of a resist film thickness to a pattern line width of the resist pattern (aspect ratio) increases so that there occur pattern collapse or stripping and lack of space pattern resolution.

In view of this, Japanese Unexamined Patent Application Publication JP-A-2005-62884 (Patent Document 1) discloses a method of using a hard mask pattern instead of a resist pattern in dry etching of a chromium light-shielding layer in order to improve the photomask CD uniformity and to reduce the thickness of a resist film. The technique disclosed in Patent Document 1 uses a hard mask layer made of a conductive substance having an advantage of the hard mask pattern and further advantages that, since it is conductive, electron beam writing can be performed well and that a large etching selectivity can be assured with respect to the chromium light-shielding layer. As the substance forming the hard mask layer, there are enumerated Mo, MoSi, MoSiON, Hf, Hf compounds, Zr, Sn, Fe, NiSi, CoSi, compounds thereof, and so on.

DISCLOSURE OF THE INVENTION

In Patent Document 1, MoSi or MoSiON is disclosed to be the conductive substance forming the hard mask layer. However, there is a problem that the conductivity of a substance mainly containing Si is low and thus even if such a substance is used, the conductivity of the hard mask layer is insufficient. For example, let it be considered that, using a mask blank having a chromium light-shielding layer, a hard mask layer, and a resist film in this order on a light-transmissive substrate, electron beam writing is carried out on the resist film. In this case, if the conductivity of the hard mask layer is insufficient, the resist film and the hard mask layer are charged up with irradiated electrons so that an irradiated electron beam is bent by this charge-up. As a result, there arises a problem that writing is effected at a position offset from a position to be originally written by the electron beam, thus resulting in degradation of writing position accuracy. Then, if the charge-up further proceeds, there arises a problem that electron beam writing cannot be effected due to the charge-up.

Further, there is a problem that a single-layer hard mask layer using Mo disclosed in Patent Document 1 cannot sufficiently function as a hard mask layer. This is because since Mo has a property of being etchable with a mixed gas of chlorine and oxygen for use in dry etching of a chromium light-shielding layer, the etching selectivity between the hard mask layer and the chromium light-shielding layer in dry etching of the chromium light-shielding layer is small.

Further, when forming a hard mask layer using one of Hf, Hf compounds, Zr, Sn, Fe, NiSi, CoSi, compounds thereof, and so on disclosed in Patent Document 1, although the conductivity is ensured, the following problems exist according to study of the present inventors. That is, Zr, Sn, and Fe tend to be oxidized and, if oxidized, the conductivity is lowered. On the other hand, if a silicide-based material such as NiSi, CoSi, MoSi, or MoSiON is used for forming a hard mask layer of a mask blank, the wettability of a resist film for electron beam writing formed on an upper surface of the hard mask layer is extremely poor with respect to the hard mask layer. Accordingly, there is a case where the thickness of the coated resist film is nonuniform or the resist film is stripped to fall off, for example, in a resist film developing process after writing. In this case, it may be considered to use a method of improving the adhesion of the resist film by performing, in advance, a surface treatment on the hard mask layer using, for example, commercial HMDS (Hexamethyldisilazane). However, according to this method, since one manufacturing process is added and further the surface treatment is carried out in the atmosphere, there occurs a disadvantage that the defect generation rate increases to degrade the yield.

It is therefore an object of this invention to solve the above-mentioned two conventional problems of the conductivity of the hard mask layer and the wettability of the resist film. Specifically, it is a first object of this invention to provide a mask blank having a hard mask film of a laminated structure that has excellent conductivity and ensures excellent wettability of a resist film and capable of manufacturing a mask excellent particularly in CD uniformity and CD linearity. It is a second object of this invention to provide a method of manufacturing a transfer mask excellent in CD uniformity and CD linearity using the above-mentioned mask blank.

In order to achieve the above-mentioned objects, this invention has the following structures.

(Structure 1)

A mask blank having, on a light-transmissive substrate, a light-shielding film made of a material mainly containing chromium, and adapted to use a resist film for electron beam writing when forming a transfer pattern in the light-shielding film, the mask blank including:

an etching mask film formed on an upper surface of the light-shielding film and made of a material containing one of a nitride and an oxynitride of silicon; and a conductive mask film formed on an upper surface of the etching mask film and made of a conductive material that is dry-etchable with a fluorine-based gas and a chlorine-based gas.

(Structure 2)

The mask blank according to Structure 1, wherein the conductive mask film is made of the conductive material containing one or more components among molybdenum, titanium, vanadium, niobium, and tungsten or a nitride or nitrides thereof.

(Structure 3)

A mask blank having a phase shift film and a light-shielding film made of a material mainly containing chromium in this order on a light-transmissive substrate, and adapted to use a resist film for electron beam writing when forming a transfer pattern in the light-shielding film and the phase shift film, the mask blank including:

an etching mask film formed on an upper surface of the light-shielding film and made of a material containing silicon; and a conductive mask film formed on an upper surface of the etching mask film and made of a conductive material that is dry-etchable with a fluorine-based gas.

(Structure 4)

The mask blank according to Structure 3, wherein the conductive mask film is made of the conductive material containing one or more components among tantalum, molybdenum, titanium, vanadium, niobium, and tungsten or a nitride or nitrides thereof.

(Structure 5)

The mask blank according to Structure 3, wherein the phase shift film is made of a material containing one of an oxide, a nitride, and an oxynitride of molybdenum silicide.

(Structure 6)

The mask blank according to Structure 1 or 3, wherein the conductive mask film has a thickness of 2 nm to 20 nm.

(Structure 7)

The mask blank according to Structure 1 or 3, wherein the resist film for electron beam writing having a thickness of 50 nm to 300 nm is formed on an upper surface of the conductive mask film.

(Structure 8)

A transfer mask manufacturing method using a mask blank having, on a light-transmissive substrate, a light-shielding film made of a material mainly containing chromium, and adapted to use a resist film for electron beam writing when forming a transfer pattern in the light-shielding film, the mask blank including an etching mask film formed on an upper surface of the light-shielding film and made of a material containing one of a nitride and an oxynitride of silicon, a conductive mask film formed on an upper surface of the etching mask film and made of a conductive material that is dry-etchable with a fluorine-based gas, and the resist film for electron beam writing formed on an upper surface of the conductive mask film, the method including the steps of:

applying electron beam writing and development to the resist film for electron beam writing, thereby forming a resist pattern;

dry-etching the conductive mask film and the etching mask film with the fluorine-based gas using the resist pattern as a mask, thereby forming a conductive mask film pattern and an etching mask film pattern; and dry-etching the light-shielding film with a mixed gas of chlorine and oxygen using the conductive mask film pattern and the etching mask film pattern as a mask, thereby forming a light-shielding film pattern.

(Structure 9)

The transfer mask manufacturing method according to Structure 8, wherein the conductive mask film is made of the conductive material that is further dry-etchable with a chlorine-based gas, and the conductive mask film pattern is removed while forming the light-shielding film pattern by dry-etching the light-shielding film with the mixed gas of chlorine and oxygen using the conductive mask film pattern and the etching mask film pattern as the mask.

(Structure 10)

The transfer mask manufacturing method according to Structure 8, wherein the mask blank further includes a phase shift film between the light-transmissive substrate and the light-shielding film, and the method further includes a step of removing the conductive mask film pattern and the etching mask film pattern while forming a phase shift film pattern by dry-etching the phase shift film with a fluorine-based gas using the light-shielding film pattern as a mask. According to this invention, it is possible to provide a mask blank capable of suppressing the degradation of writing position accuracy and the charge-up phenomenon in electron beam writing onto a resist film and capable of manufacturing a mask excellent particularly in CD uniformity and CD linearity. This mask blank comprises a hard mask film having a laminated structure of an etching mask film and a conductive mask film. This hard mask film has a function of a hard mask and has an advantage that since it has excellent conductivity, electron beam writing can be performed well and, since it ensures excellent wettability of the resist film, the adhesion between the mask blank and the resist film can be improved. Further, according to this invention, it is possible to provide a method of manufacturing a transfer mask excellent in CD uniformity and CD linearity using the above-mentioned mask blank.

DETAILED DESCRIPTION OF THE INVENTION

Hereinbelow, embodiments of this invention will be described in detail with reference to the drawings.
(First Embodiment)

Figure 1:
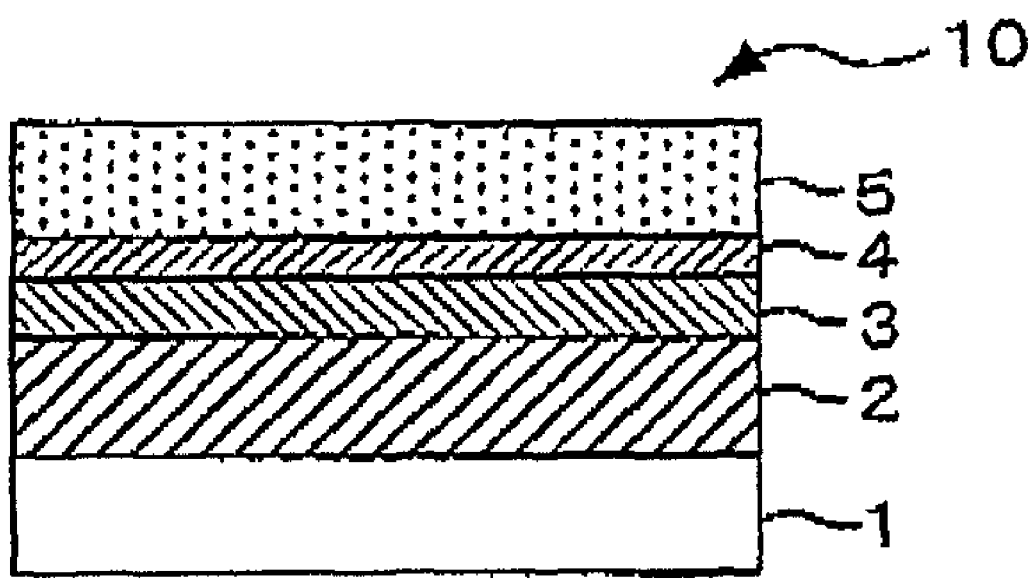
FIG. 1 is a sectional view showing a schematic structure of a mask blank according to a first embodiment of this invention.

FIG. 1 is a sectional view showing a schematic structure of a mask blank according to a first embodiment of this invention.

In FIG. 1, a mask blank 10 comprises a light-shielding film 2, an etching mask film 3, a conductive mask film 4, and a resist film 5 for electron beam writing which are formed in this order on a light-transmissive substrate 1. Herein, a glass substrate is generally used as the light-transmissive substrate 1. Since the glass substrate is excellent in flatness and smoothness, when pattern transfer onto a semiconductor substrate is performed using a photomask, high-accuracy pattern transfer can be carried out without causing strain or the like of a transfer pattern.

The light-shielding film 2 is made of a material mainly containing chromium. As a specific material of the light-shielding film 2, use is preferably made of chromium alone or a material containing chromium and, for example, an additional element/elements adapted to increase the dry etching rate as compared with chromium alone. The material preferably contains, for example, oxygen and/or nitrogen as the additional element/elements adapted to increase the dry etching rate as compared with chromium alone. When oxygen is contained in the light-shielding film 2, the content of oxygen is preferably in the range of 5 to 80 at %. If the content of oxygen is less than 5 at %, it is difficult to obtain the effect that the dry etching rate is made faster than chromium alone.

On the other hand, if the content of oxygen exceeds 80 at %, the absorption coefficient for laser light with a wavelength of 200 nm or less, for example, ArF excimer laser light (wavelength 193 nm), is reduced. Therefore, it becomes necessary to increase the thickness of the film in order to obtain the required optical density.

On the other hand, when nitrogen is contained in the light-shielding film 2, the content of nitrogen is preferably in the range of 20 to 80 at %. If the content of nitrogen is less than 20 at %, it is difficult to obtain the effect that the dry etching rate is made faster than chromium alone. On the other hand, if the content of nitrogen exceeds 80 at %, the absorption coefficient for laser light with a wavelength of 200 nm or less, for example, ArF excimer laser light (wavelength 193 nm), is reduced. Therefore, it becomes necessary to increase the thickness of the film in order to obtain the required optical density.

Both oxygen and nitrogen may be contained in the light-shielding film 2. In this case, the total content of oxygen and nitrogen is preferably set in the range of 10 to 80 at %. When both oxygen and nitrogen are contained in the light-shielding film 2, the content ratio of oxygen and nitrogen is not particularly limited but is properly determined in consideration of the adsorption coefficient and so on.

The light-shielding film 2 containing oxygen and/or nitrogen may further contain an element such as carbon or hydrogen. The light-shielding film 2 is not limited to a single layer but may have a plural-layer structure with layers of different compositions. Alternatively, the light-shielding film 2 may be a composition gradient film having a stepwise or continuous gradient in composition along a thickness direction thereof.

It is not necessary that a method of forming the light-shielding film 2 be particularly limited, but nevertheless, a sputtering film forming method is in particular preferably used. Since a film with a uniform composition and a constant thickness can be formed according to the sputtering film forming method, it is suitable for this invention. When the light-shielding film 2 is deposited on the light-transmissive substrate 1 by the sputtering film forming method, a chromium (Cr) target is used as a sputtering target and, as a sputtering gas introduced into a chamber, use is made of a gas obtained by mixing a gas such as oxygen, nitrogen, or carbon dioxide into an argon gas. When use is made of the sputtering gas obtained by mixing the oxygen gas or carbon dioxide gas into the argon gas, it is possible to form a light-shielding film containing oxygen in chromium. When use is made of the sputtering gas obtained by mixing the nitrogen gas into the argon gas, it is possible to form a light-shielding film containing nitrogen in chromium.

The thickness of the light-shielding film 2 is preferably 90 nm or less. This is because it is considered that if the thickness of the film exceeds 90 nm, it becomes difficult to form a recent submicron-level fine pattern due to the pattern microloading phenomenon and so on in dry etching. By reducing the thickness of the film to a certain degree, a reduction in aspect ratio of a pattern (the ratio of a pattern height (depth) to a pattern width) can be achieved. Therefore, it is possible to reduce the line width error caused by the global loading phenomenon and microloading phenomenon. Further, by reducing the thickness of the film to a certain degree, it becomes possible to prevent damage (collapse or the like) to a pattern, particularly a pattern having a submicron-level pattern size. The light-shielding film 2 in this invention can obtain a required optical density (normally 3.0 or more) at an exposure wavelength of 200 nm or less even if the thickness of the film is reduced to 90 nm or less. There is no lower limit to the thickness of the light-shielding film 2 as long as the required optical density can be obtained.

The etching mask film 3 is formed on an upper surface of the light-shielding film 2 and made of a material containing a nitride or oxynitride of silicon. As a specific material of the etching mask film 3, use is preferably made of a material such as SiN, SiON, MoSiN, or MoSiON. The etching mask film 3 made of the material containing the nitride or oxynitride of silicon has a property of being hardly etched with a mixed gas of chlorine and oxygen for use in dry etching of the light-shielding film 2 mainly composed of chromium. Therefore, the etching mask film 3 has a large etching selectivity with respect to the light-shielding film 2 and thus can serve as a hard mask in dry etching of the light-shielding film 2.

As will be described later, when the mask blank 10 of this embodiment is used to produce a photomask by patterning the light-shielding film 2, the etching mask film 3 remains on the patterned light-shielding film 2 and serves as an antireflection film (i.e. serving as both an etching mask film and an antireflection film). With the antireflection film made of the material containing the nitride or oxynitride of silicon on the light-shielding film 2, the reflectance at the exposure wavelength can be suppressed to, for example, 20% or less, preferably 15% or less, which is thus preferable in terms of reducing the influence of a standing wave in use of the photomask. Further, in terms of detecting a defect with high accuracy, it is preferable to suppress the reflectance to, for example, 30% or less with respect to a wavelength (e.g. 257 nm, 364 nm, or 488 nm) for use in a defect inspection of a mask blank or photomask. Particularly, if the etching mask film 3 is in the form of an oxynitride film of SiON, MoSiON, or the like, it is possible to reduce the reflectance at the exposure wavelength and, further, to suppress the reflectance at the inspection wavelength (particularly 257 nm) to 20% or less, which is thus preferable.

The conductive mask film 4 is formed on an upper surface of the etching mask film 3 and made of a conductive material that is dry-etchable with a fluorine-based gas and a chlorine-based gas.

By providing such a conductive mask film 4 on the upper surface of the etching mask film 3, it is possible to improve the conductivity when the etching mask film 3 made of the material containing the nitride or oxynitride of silicon is provided as a hard mask film on the light-shielding film 2 and further to improve the wettability of the resist film 5 for electron beam writing formed on an upper surface of the mask blank 10, i.e. an upper surface of the conductive mask film 4. That is, a hard mask film having a laminated structure of the etching mask film 3 and the conductive mask film 4 has a function of a hard mask and, since it has excellent conductivity, electron beam writing can be performed well and, since it ensures excellent wettability of the resist film, the adhesion between the mask blank and the resist film can be improved.

The conductive mask film 4 is preferably made of a conductive material containing one or more components among molybdenum, titanium, vanadium, niobium, and tungsten or a nitride or nitrides thereof. As a specific material, use is preferably made of, for example, MoN, TiN, VN, NbN, WN, Mo, Ti, V, or Nb.

It is not necessary that a method of forming the etching mask film 3 or the conductive mask film 4 be particularly limited, but like in the case of the light-shielding film 2, the sputtering film forming method is preferably used.

The thickness of the etching mask film 3 can be reduced as long as it can serve as an etching mask in terms of the thickness of the light-shielding film 2. If the thickness of the etching mask film 3 is large, the necessity arises to increase the thickness of the resist film for use in patterning the laminated film of the conductive mask film 4 and the etching mask film 3 so that there is a possibility of reduction in pattern transfer accuracy. Therefore, the thickness of the etching mask film 3 is preferably 5 nm to 30 nm.

The thickness of the conductive mask film 4 is preferably in the range of 2 nm to 20 nm. This is because if the thickness of the conductive mask film 4 is less than 2 nm, there is a case where required conductivity cannot be sufficiently obtained and, further, unevenness in film thickness becomes large when forming the film. On the other hand, if the thickness exceeds 20 nm, the necessity arises to increase the thickness of the resist film for use in patterning the laminated film of the conductive mask film 4 and the etching mask film 3 so that there is a possibility of reduction in pattern transfer accuracy. The thickness of the laminated film of the etching mask film 3 and the conductive mask film 4 is preferably in the range of 7 nm to 32 nm. This is because if the total thickness of the laminated film is less than 7 nm, the function as an etching mask for the light-shielding film 2 becomes insufficient, while, if the total thickness of the laminated film exceeds 32 nm, the necessity arises to increase the thickness of the resist film so that there is a possibility of reduction in pattern transfer accuracy.

As shown in FIG. 1, the mask blank of this embodiment may be in the form where the resist film 5 for electron beam writing is formed on the conductive mask film 4. The thickness of the resist film 5 is preferably as thin as possible in order to make excellent the pattern accuracy (CD accuracy) of the laminated film of the conductive mask film 4 and the etching mask film 3. Specifically, the thickness of the resist film 5 is preferably 300 nm or less, more preferably 200 nm or less, and further preferably 150 nm or less. The lower limit of the thickness of the resist film 5 is set such that the resist film remains when the laminated film of the conductive mask film 4 and the etching mask film 3 has been dry-etched using a resist pattern as a mask, and is set to, for example, 50 nm or more. In order to obtain a high resolution, a material of the resist film 5 is preferably a chemically amplified resist having high resist sensitivity. The chemically amplified resist is better in dry etching resistance as compared with a polymer resist having been generally used in electron beam writing and thus the thickness of the resist film can be further reduced.

Now, a description will be given of a photomask (transfer mask) manufacturing method using the photomask blank 10 shown in FIG. 1.

FIGS. 2A to 2D are sectional views showing, in sequence, manufacturing processes of a photomask using the mask blank 10.

Figure 2A:
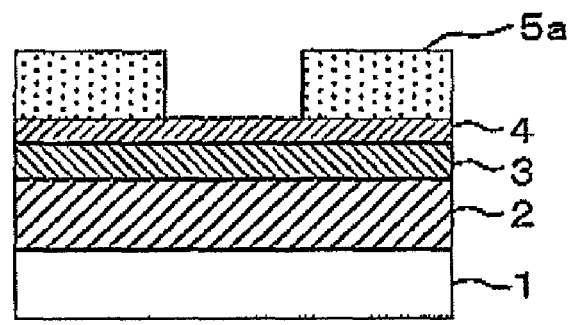
FIGS. 2A to 2D are sectional views showing manufacturing processes of a photomask using the mask blank of FIG. 1.

Using an electron beam writing apparatus, a required pattern is written on the resist film 5 (herein, a positive resist film for electron beam writing is used) formed on the mask blank 10 shown in FIG. 1 and, after writing, the resist film 5 is developed, thereby forming a resist pattern 5a (see FIG. 2A).

In this embodiment, since the wettability of the resist film 5 for electron beam writing formed on the upper surface of the conductive mask film 4 is excellent, it is possible to improve the adhesion between the mask blank and the resist film. Further, in this embodiment, by providing on the light-shielding film 2 the hard mask film having the laminated structure of the etching mask film 3 and the conductive mask film 4, the hard mask film serves as a hard mask and, further, since the hard mask film has excellent conductivity, electron beam writing onto the resist film 5 can be performed well.

Figure 2B:
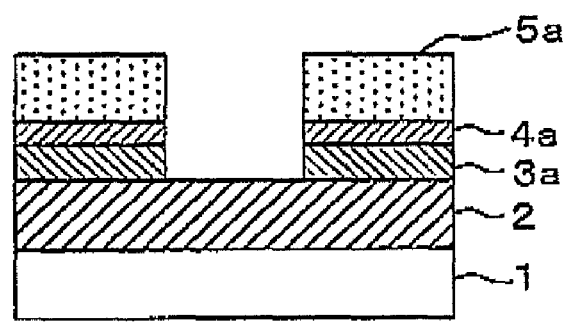

Then, using the resist pattern 5a as a mask, the laminated film of the conductive mask film 4 and the etching mask film 3 is dry-etched using a fluorine-based gas (e.g. $SF_6$), thereby forming a conductive mask film pattern 4a and an etching mask film pattern 3a (see FIG. 2B). The conductive mask film 4 and the etching mask film 3 in this embodiment both can be dry-etched well using the fluorine-based gas.

Figure 2C:
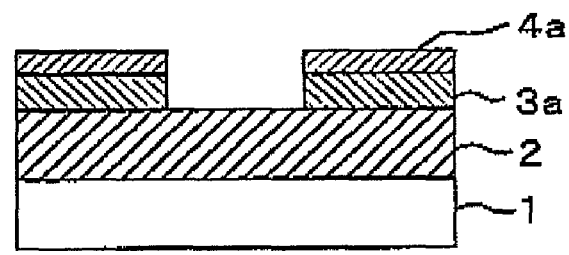

Then, the remaining resist pattern 5a is stripped and removed (see FIG. 2C).

Figure 2D:
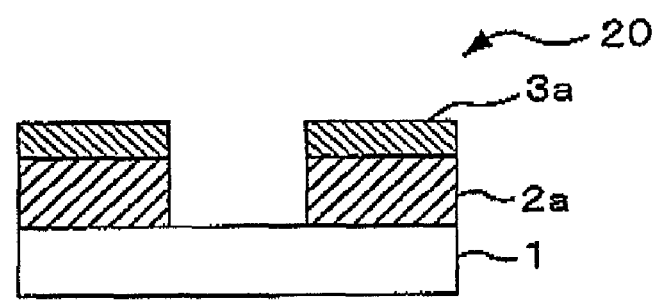

Then, using the conductive mask film pattern 4a and the etching mask film pattern 3a as a mask, the light-shielding film 2 is dry-etched using a mixed gas of a chlorine-based compound (e.g. $Cl_2$, $SiCl_4$, HCl, $CCl_4$, or $CHCl_3$) and oxygen, thereby forming a light-shielding film pattern 2a (see FIG. 2D).

Since the conductive mask film 4 in this embodiment is made of the conductive material that is dry-etchable with the fluorine-based gas and the mixed gas of chlorine and oxygen, when the light-shielding film 2 is dry-etched with the mixed gas of chlorine and oxygen, the conductive mask film pattern 4a is removed while forming the light-shielding film pattern 2a.

In this manner, a photomask 20 is produced in which a pattern in the form of a laminated film of the light-shielding film pattern 2a and the etching mask film pattern 3a having an antireflection function is formed on the light-transmissive substrate 1 as shown in FIG. 2D.

As described above, the mask blank of this embodiment has, on the light-shielding film, the hard mask film having the laminated structure of the etching mask film and the conductive mask film. This hard mask film realizes a function of a hard mask and, since it has excellent conductivity, electron beam writing can be performed well and, since it ensures excellent wettability of the resist film, the adhesion between the mask blank and the resist film can be improved. Using this mask blank, it is possible to manufacture a photomask excellent particularly in CD uniformity and CD linearity.

(Second Embodiment)

A mask blank according to a second embodiment of this invention will be described with reference to FIG. 3. This embodiment relates to a phase shift mask blank and a phase shift mask obtained using such a mask blank.

Figure 3:
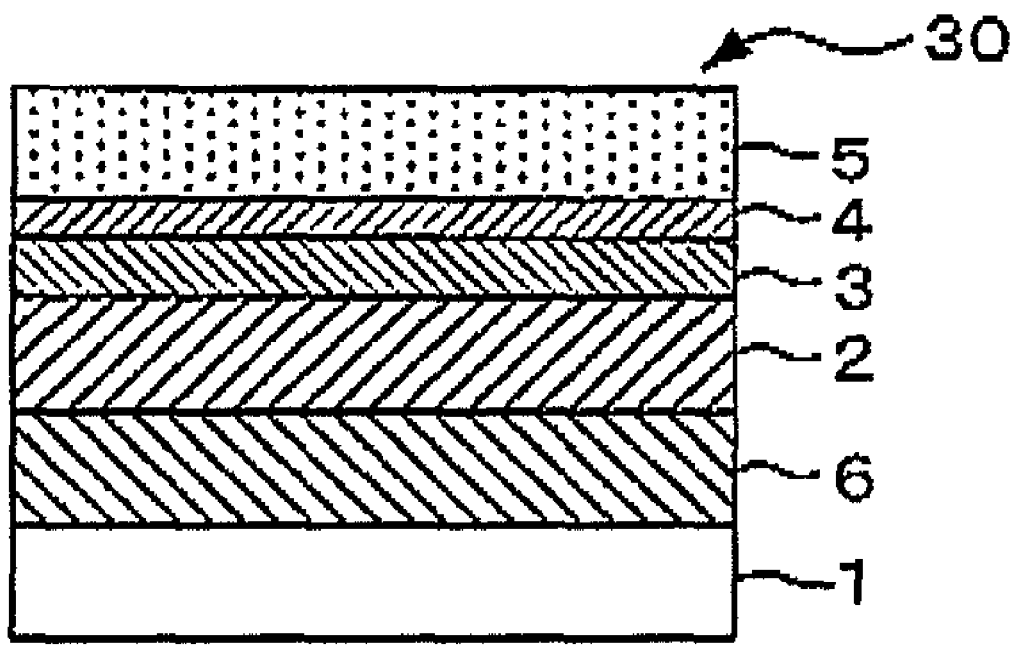
FIG. 3 is a sectional view showing a schematic structure of a mask blank according to a second embodiment of this invention.

In FIG. 3, a mask blank 30 comprises a phase shift film 6, a light-shielding film 2, an etching mask film 3, a conductive mask film 4, and a resist film 5 for electron beam writing which are formed in this order on a light-transmissive substrate 1. Since the light-transmissive substrate 1 is the same as that in the above-mentioned first embodiment, a description thereof is omitted.

The phase shift film 6 transmits light having an intensity that does not substantially contribute to exposure (e.g. 1% to 20% with respect to an exposure wavelength) and is adapted to produce a predetermined phase difference. The phase shift film 6 is for providing a relationship where the phase of light transmitted through a light-semitransmissive portion obtained by patterning the phase shift film 6 is substantially inverted with respect to the phase of light transmitted through a light-transmissive portion, where the phase shift film 6 is removed (not formed), which transmits light having an intensity that substantially contributes to exposure. In other words, the phase shift film 6 is provided so that the lights transmitted through the neighborhood of a boundary portion between the light-semitransmissive portion and the light-transmissive portion and bending into the others' regions by a diffraction phenomenon are canceled each other, thereby causing the light intensity at the boundary portion to be approximately zero so as to improve the contrast, i.e. the resolution, at the boundary portion.

The phase shift film 6 is preferably made of a material having etching characteristics different from those of the light-shielding film 2 formed thereon. For example, as the material of the phase shift film 6, use is preferably made of a material containing one of an oxide, a nitride, and an oxynitride of a metal silicide such as molybdenum silicide, tantalum silicide, tungsten silicide, or zirconium silicide. More preferably, use is made of an oxide, nitride, or oxynitride of molybdenum silicide. The phase shift film 6 may have a single-layer or multilayer structure. For example, use is made of a phase shift film of a two-layer structure in which a film mainly having a transmittance adjusting function and a film mainly having a phase difference adjusting function are stacked from the substrate side. For example, use is made of a phase shift film having a two-layer structure of a TaHf film mainly having a transmittance adjusting function and a SiON film mainly having a phase difference adjusting function.

The phase shift film 6 is formed by, for example, the sputtering film forming method and the thickness thereof is appropriately set in consideration of the transmittance and phase difference with respect to the exposure wavelength.

The light-shielding film 2 is the same as that in the above-mentioned first embodiment, but, in this embodiment, the light-shielding film 2 preferably includes an antireflection layer at a surface layer portion (top layer portion) thereof. In this case, as the antireflection layer, a material of, for example, CrON, CrO, CrCO, or CrCON is preferably used. In terms of reducing the influence of a standing wave in use of a photomask, it is preferable to suppress the reflectance at the exposure wavelength to, for example, 20% or less, preferably 15% or less by providing the antireflection layer in the light-shielding film 2. Further, in terms of detecting a defect with high accuracy, it is preferable to suppress the reflectance to, for example, 30% or less with respect to a wavelength (e.g. 257 nm, 364 nm, or 488 nm) for use in a defect inspection of a mask blank or photomask. Particularly, using the antireflection layer containing carbon, it is possible to reduce the reflectance at the exposure wavelength and, further, to suppress the reflectance at the inspection wavelength (particularly 257 nm) to 20% or less.

In this embodiment, the etching mask film 3 is formed on an upper surface of the light-shielding film 2 and made of a material containing silicon. As a specific material of the etching mask film 3, use is made of a material containing one of an oxide, a nitride, and an oxynitride of silicon or molybdenum silicide. For example, use is preferably made of a material such as SiN, SiON, MoSiN, or MoSiON.

The etching mask film 3 made of the material containing silicon has a property of being hardly etched with a mixed gas of chlorine and oxygen for use in dry etching of the light-shielding film 2 mainly composed of chromium. Therefore, the etching mask film 3 has a large etching selectivity with respect to the light-shielding film 2 and thus can serve as a hard mask in dry etching of the light-shielding film 2.

When a photomask is produced using the mask blank 30 of this embodiment, the etching mask film 3 does not remain on the patterned light-shielding film 2 and therefore it is not necessary to give consideration to providing the etching mask film 3 with an antireflection function.

In this embodiment, the conductive mask film 4 is formed on an upper surface of the etching mask film 3 and made of a conductive material that is dry-etchable with a fluorine-based gas. By providing such a conductive mask film 4 on the upper surface of the etching mask film 3, it is possible to improve the conductivity when the etching mask film 3 made of the material containing silicon is provided as a hard mask film on the light-shielding film 2 and further to improve the wettability of the resist film 5 for electron beam writing formed on an upper surface of the conductive mask film 4.

In this embodiment, the conductive mask film 4 is required to be dry-etchable with at least a fluorine-based gas. For example, the conductive mask film 4 is preferably made of a conductive material containing one or more components among tantalum, molybdenum, titanium, vanadium, niobium, and tungsten or a nitride or nitrides thereof. As a specific material, use is preferably made of, for example, TaN, MoN, TiN, VN, NbN, WN, Ta, Mo, Ti, V, or Nb. Among them, molybdenum, titanium, vanadium, niobium, tungsten, and nitrides thereof are dry-etchable not only with the fluorine-based gas but also with a mixed gas of chlorine and oxygen.

Since a forming method and the thickness of each of the etching mask film 3 and the conductive mask film 4 are the same as those in the above-mentioned first embodiment, a description thereof is omitted herein.

As shown in FIG. 3, the mask blank 30 of this embodiment may also be in the form where the resist film 5 for electron beam writing is formed on the conductive mask film 4. The thickness of the resist film 5 is the same as that in the above-mentioned first embodiment.

Now, a description will be given of a photomask (transfer mask) manufacturing method using the photomask blank 30 shown in FIG. 3.

FIGS. 4A to 4H are sectional views showing, in sequence, manufacturing processes of a photomask using the mask blank 30.

Figure 4A:
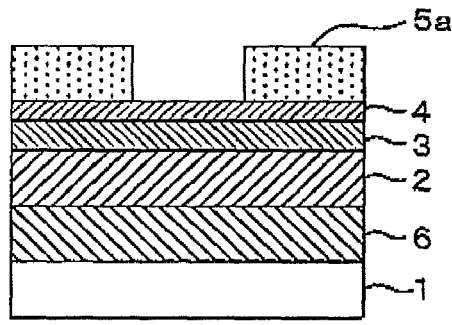
FIGS. 4A to 4H are sectional views showing manufacturing processes of a photomask using the mask blank of FIG. 3.

Using an electron beam writing apparatus, a required pattern is written on the resist film 5 (herein, a positive resist film for electron beam writing is used) formed on the mask blank 30 shown in FIG. 3 and, after writing, the resist film 5 is developed, thereby forming a resist pattern 5a (see FIG. 4A).

In this embodiment, since the wettability of the resist film 5 for electron beam writing formed on the upper surface of the conductive mask film 4 is excellent, it is possible to improve the adhesion between the mask blank and the resist film. Further, in this embodiment, a hard mask film having a laminated structure of the etching mask film 3 and the conductive mask film 4 is provided on the light-shielding film 2 to separate the functions. The hard mask film serves as a hard mask and, further, since the hard mask film has excellent conductivity, electron beam writing onto the resist film 5 can be performed well.

Figure 4E:
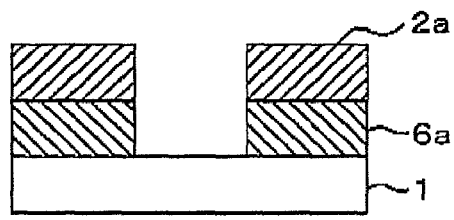
Figure 4B:
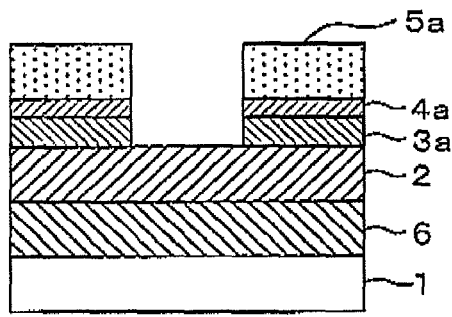

Then, using the resist pattern 5a as a mask, the laminated film of the conductive mask film 4 and the etching mask film 3 is dry-etched using a fluorine-based gas (e.g. $SF_6$), thereby forming a conductive mask film pattern 4a and an etching mask film pattern 3a (see FIG. 4B). The conductive mask film 4 and the etching mask film 3 in this embodiment both can be dry-etched well using the fluorine-based gas.

Figure 4F:
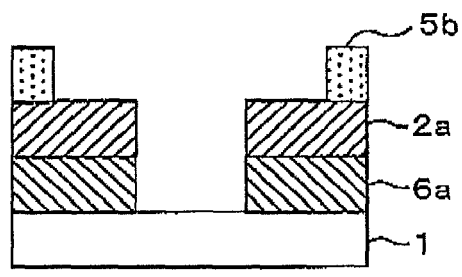
Figure 4C:
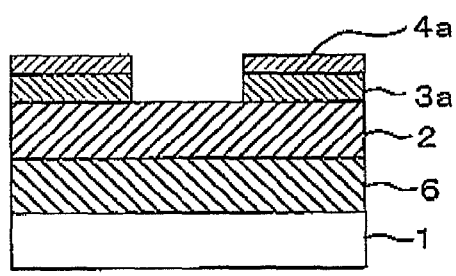
Figure 4G:
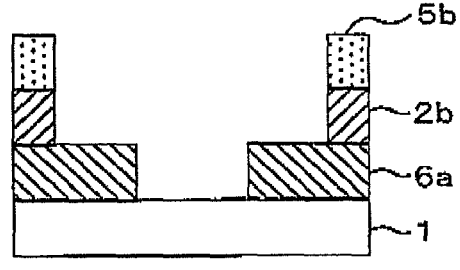

Then, the remaining resist pattern 5a is stripped and removed (see FIG. 4C).

Figure 4D:
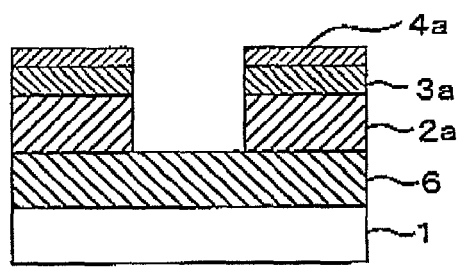

Then, using the conductive mask film pattern 4a and the etching mask film pattern 3a as a mask, the light-shielding film 2 is dry-etched using a mixed gas of a chlorine-based compound (e.g. $Cl_2$, $SiCl_4$, HCl, $CCl_4$, or $CHCl_3$) and oxygen, thereby forming a light-shielding film pattern 2a (see FIG. 4D).

If the conductive mask film 4 is made of a conductive material that is dry-etchable not only with the fluorine-based gas but also with the mixed gas of chlorine and oxygen, when the light-shielding film 2 is dry-etched with the mixed gas of chlorine and oxygen, the conductive mask film pattern 4a is removed while forming the light-shielding film pattern 2a.

Then, using the light-shielding film pattern 2a as a mask, the phase shift film 6 is dry-etched with a fluorine-based gas, thereby forming a phase shift film pattern 6a (see FIG. 4E). In this event, the exposed conductive mask film pattern 4a and etching mask film pattern 3a (only the etching mask film pattern 3a when the conductive mask film pattern 4a is already removed in the process shown in FIG. 4D) are also etched with the fluorine-based gas to be removed.

Then, a resist film, which is the same as that described above, is coated again and, after writing a pattern to be used for removing an unnecessary portion of the light-shielding film pattern 2a in a transfer area, the resist film is developed, thereby forming a resist pattern 5b on the light-shielding film pattern 2a at a portion to be left as a light-shielding band (see FIG. 4F). Then, a light-shielding film pattern 2b with the unnecessary portion removed by dry etching with a mixed gas of chlorine and oxygen is formed (see FIG. 4G). Finally, the remaining resist pattern 5b is stripped, thereby obtaining a phase shift mask 40 (see FIG. 4H).

Figure 4H:
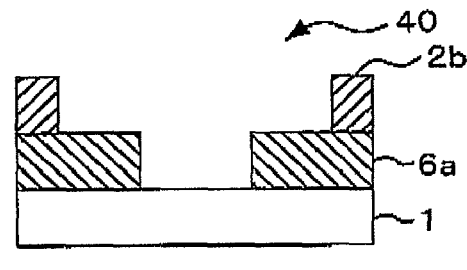

In this manner, the phase shift mask 40 is produced in which the phase shift film pattern 6a is formed on the light-transmissive substrate 1 and the light-shielding film pattern 2b is formed on the phase shift film pattern 6a at a portion thereof as shown in FIG. 4H.

As described above, the mask blank of this embodiment has, on the light-shielding film, the hard mask film having the laminated structure of the etching mask film and the conductive mask film. This hard mask film realizes a function of a hard mask and, since it has excellent conductivity, electron beam writing can be performed well and, since it ensures excellent wettability of the resist film, the adhesion between the mask blank and the resist film can be improved. With this mask blank, since the light-shielding film pattern with high CD accuracy is formed and further this light-shielding film pattern is transferred onto the phase shift film, it is possible to manufacture a phase shift mask excellent particularly in CD uniformity and CD linearity.

Hereinbelow, mask blanks and transfer mask manufacturing methods of this invention will be described in further detail in terms of Examples. A description will also be given of Comparative Examples in contrast to the Examples.

EXAMPLE 1

Using a DC magnetron sputtering apparatus and using a chromium target as a sputtering target, reactive sputtering at a power of 1.8 kW was carried out in a mixed gas atmosphere of argon, nitrogen, carbon dioxide, and helium (Ar: 18 sccm, $N_2$: 10 sccm, $CO_2$: 18.8 sccm, He: 32 sccm), thereby forming a back-surface antireflection layer of CrOCN having a thickness of 12 nm on a light-transmissive substrate of quartz glass.

Then, using the chromium target, reactive sputtering at a power of 1.71 kW was carried out in a mixed gas atmosphere of argon, nitrogen monoxide, and helium (Ar: 13 sccm, NO: 11.1 sccm, He: 32 sccm), thereby forming a light-shielding layer of CrON having a thickness of 55 nm. In this manner, a light-shielding film composed of the back-surface antireflection layer and the light-shielding layer and having a total thickness of 67 nm was formed.

Then, using a mixed target of Mo and Si (the content of Mo to the total content of Mo and Si is 9.5%) as a sputtering target, reactive sputtering at a power of 1.8 kW was carried out in a mixed gas atmosphere of argon, nitrogen monoxide, and helium (Ar: 8 sccm, NO: 29 sccm, He: 32 sccm), thereby forming an etching mask film (which will also serve as an antireflection film and will hereinafter be referred to as an "antireflection/etching mask film") of MoSiON having a thickness of 15 nm.

In the reactive sputtering, a pulse generating unit is inserted between a DC power supply and a sputtering cathode, thereby carrying out DC pulse sputtering.

Subsequently, using a Mo target as a sputtering target, reactive sputtering at a power of 0.6 kW was carried out in a mixed gas atmosphere of argon and nitrogen (Ar: 24 sccm, $N_2$: 3 sccm), thereby forming a conductive mask film of MoN having a thickness of 3 nm.

In the laminated structure of the back-surface antireflection layer, the light-shielding layer, and the antireflection/etching mask film formed as described above, the reflectance for ArF excimer laser light (wavelength: 193 nm) was 5.5% and there was an antireflection function to suppress reflection of returning light from the back surface side of the light-transmissive substrate. Further, in the laminated structure of the back-surface antireflection layer, the light-shielding layer, and the antireflection/etching mask film, the optical density (OD) for ArF excimer laser light (wavelength: 193 nm) was 3.0.

In this manner, a binary mask blank was produced.

Then, using this binary mask blank, a photomask was manufactured.

First, on the mask blank, a positive resist film for electron beam writing (PRL009: manufactured by FUJIFILM Electronic Materials Co., Ltd.) was formed to a thickness of 150 nm. The resist film was formed by spin coating using a spinner (spin coating apparatus). There was no problem in wettability of the resist film. After coating the resist film, a predetermined baking treatment was carried out using a baking apparatus.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the conductive mask film and the antireflection/etching mask film were dry-etched, thereby forming a conductive mask film pattern and an antireflection/etching mask film pattern. A fluorine-based $SF_6$ gas was used as a dry etching gas.

Subsequently, after stripping the remaining resist pattern, the light-shielding film comprising the back-surface antireflection layer and the light-shielding layer was dry-etched using the antireflection/etching mask film pattern as a mask, thereby forming a light-shielding film pattern. A mixed gas of $Cl_2$ and $O_2$ ($Cl_2$:$O_2$=4:1) was used as a dry etching gas. Since the conductive mask film pattern was removed by dry etching of the light-shielding film, the antireflection/etching mask film pattern was exposed on a surface of the formed pattern upon completion of dry etching of the light-shielding film.

In this manner, a photomask of this Example was obtained.

The obtained photomask of this Example was evaluated by deriving as a CD linearity a deviation amount between a designed value of the pattern line width and a measured value of the pattern line width of the obtained light-shielding film pattern. The CD linearity of the photomask of this Example was 3 nm. This value fully satisfied the value of CD linearity required for a photomask in the semiconductor design rule of DRAM half-pitch 32 nm. Further, the CD uniformity was also fully satisfied.

Mask blanks were produced in the same manner as in the above-mentioned Example 1 except that WN, TiN, VN, NbN, Mo, Ti, V, and Nb were used as materials of conductive mask films, respectively, instead of the above-mentioned MoN. Then, photomasks were produced using these mask blanks, respectively. In any of the photomasks, a light-shielding film pattern with an excellent CD linearity of 3 nm to 4 nm was obtained. Further, mask blanks were produced in the same manner as in Example 1 except that conductive mask films were made of the above-mentioned materials, respectively, and the thickness of each conductive mask film was set to 2 nm. Then, photomasks were produced using these mask blanks, respectively. In any of the photomasks, the CD linearity was 4 nm or less and thus fully satisfied the value of CD linearity required for a photomask in the semiconductor design rule of DRAM half-pitch 32 nm. Further, the CD uniformity was also fully satisfied in any of the photomasks.

EXAMPLE 2

Using a DC magnetron sputtering apparatus and using a mixed target of Mo and Si (the content of Mo to the total content of Mo and Si is 9.5%) as a sputtering target, reactive sputtering at a power of 2.8 kW was carried out in a mixed gas atmosphere of argon, nitrogen, and helium (Ar: 9 sccm, $N_2$: 81 sccm, He: 76 sccm), thereby forming a phase shift film of MoSiN having a thickness of 69 nm on a light-transmissive substrate of quartz glass. This phase shift film was such that the transmittance was 6% and the phase shift amount was approximately 180o for ArF excimer laser light (wavelength: 193 nm).

Then, using the DC magnetron sputtering apparatus and using a chromium target as a sputtering target, reactive sputtering at a power of 1.5 kW was carried out in a mixed gas atmosphere of argon, carbon dioxide, nitrogen, and helium (Ar: 20 sccm, $CO_2$: 35 sccm, $N_2$: 5 sccm, He: 30 sccm), thereby forming a back-surface antireflection layer of CrOCN having a thickness of 30 nm on the phase shift film.

Then, using the chromium target, reactive sputtering at a power of 1.7 kW was carried out in a mixed gas atmosphere of argon and nitrogen (Ar: 25 sccm, $N_2$: 5 sccm), thereby forming a light-shielding layer of CrN having a thickness of 4 nm.

Then, using the chromium target, reactive sputtering at a power of 1.7 kW was carried out in a mixed gas atmosphere of argon, carbon dioxide, nitrogen, and helium (Ar: 20 sccm, $CO_2$: 35 sccm, $N_2$: 10 sccm, He: 30 sccm), thereby forming an antireflection layer of CrOCN having a thickness of 14 nm. In this manner, a light-shielding film composed of the back-surface antireflection layer, the light-shielding layer, and the antireflection layer and having a total thickness of 48 nm was formed.

Then, using a mixed target of Mo and Si (the content of Mo to the total content of Mo and Si is 9.5%) as a sputtering target, reactive sputtering at a power of 1.8 kW was carried out in a mixed gas atmosphere of argon, nitrogen monoxide, and helium (Ar: 8 sccm, NO: 29 sccm, He: 32 sccm), thereby forming an etching mask film of MoSiON having a thickness of 12 nm.

In the reactive sputtering, a pulse generating unit is inserted between a DC power supply and a sputtering cathode, thereby carrying out DC pulse sputtering.

Subsequently, using a Mo target as a sputtering target, reactive sputtering at a power of 0.6 kW was carried out in a mixed gas atmosphere of argon and nitrogen (Ar: 24 sccm, $N_2$: 3 sccm), thereby forming a conductive mask film of MoN having a thickness of 3 nm.

In the laminated structure of the phase shift film and the light-shielding film (the back-surface antireflection layer, the light-shielding layer, and the antireflection layer) formed as described above, the reflectance for ArF excimer laser light (wavelength: 193 nm) was 23.6% and there was an antireflection function to suppress reflection of returning light from the back surface side of the light-transmissive substrate. Further, in the laminated structure of the phase shift film and the light-shielding film, the optical density (OD) for ArF excimer laser light (wavelength: 193 nm) was 3.1.

In this manner, a halftone phase shift mask blank was produced.

Then, using this phase shift mask blank, a phase shift mask was manufactured.

First, on the mask blank, a positive resist film for electron beam writing (PRL009: manufactured by FUJIFILM Electronic Materials Co., Ltd.) was formed to a thickness of 150 nm. The resist film was formed by spin coating using a spinner (spin coating apparatus). There was no problem in wettability of the resist film. After coating the resist film, a predetermined baking treatment was carried out using a baking apparatus.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the conductive mask film and the etching mask film were dry-etched, thereby forming a conductive mask film pattern and an etching mask film pattern. A fluorine-based $SF_6$ gas was used as a dry etching gas.

Subsequently, after stripping the remaining resist pattern, the light-shielding film in the form of the laminate of the back-surface antireflection layer, the light-shielding layer, and the antireflection layer was dry-etched using the etching mask film pattern as a mask, thereby forming a light-shielding film pattern. A mixed gas of $Cl_2$ and $O_2$ ($Cl_2$:$O_2$=4:1) was used as a dry etching gas. Since the conductive mask film pattern was removed by dry etching of the light-shielding film, the etching mask film pattern was exposed on a surface of the formed light-shielding film pattern upon completion of dry etching of the light-shielding film.

Then, using the light-shielding film pattern as a mask, the phase shift film was dry-etched, thereby forming a phase shift film pattern. A fluorine-based $SF_6$ gas was used as a dry etching gas. Since the etching mask film pattern was removed by dry etching of the phase shift film, the light-shielding film pattern was exposed upon completion of dry etching of the phase shift film.

Then, a resist film, which was the same as that described above, was coated again and, after writing a pattern to be used for removing an unnecessary portion of the light-shielding film pattern in a transfer area, the resist film was developed, thereby forming a resist pattern. Then, the unnecessary portion of the light-shielding film pattern was removed by dry etching with a mixed gas of $Cl_2$ and $O_2$ ($Cl_2$:$O_2$=4:1) and then the remaining resist pattern was stripped, thereby obtaining a phase shift mask of this Example.

The CD linearity of the phase shift film pattern in the obtained phase shift mask of this Example was 3 nm and thus fully satisfied the value of CD linearity required for a photomask in the semiconductor design rule of DRAM half-pitch 32 nm. Further, the CD uniformity was also fully satisfied. As carried out in Example 1, mask blanks and photomasks were produced in the same manner as in Example 2 except changing the material of the conductive mask film. In any of the photomasks, a light-shielding film pattern with an excellent CD linearity of 3 nm to 4 nm was obtained. Further, mask blanks were produced in the same manner as in Example 2 except that conductive mask films were made of the above-mentioned materials, respectively, the thickness of each conductive mask film was set to 2 nm, and the thickness of each etching mask film was set to 5 nm. Then, photomasks were produced using these mask blanks, respectively. In any of the photomasks, the CD linearity was less than 5 nm and thus fully satisfied the value of CD linearity required for a photomask in the semiconductor design rule of DRAM half-pitch 32 nm. Further, the CD uniformity was also fully satisfied in any of the photomasks.

EXAMPLE 3

A phase shift mask blank of this Example was produced in the same manner as in Example 2 except that a conductive mask film of TaN formed in the following manner was used instead of the conductive mask film of MoN in the phase shift mask blank of Example 2.

Using a Ta target as a sputtering target, reactive sputtering at a power of 1.5 kW was carried out in a mixed gas atmosphere of xenon and nitrogen (Xe: 11 sccm, $N_2$: 15 sccm), thereby forming a conductive mask film of TaN having a thickness of 3 nm.

Using the obtained phase shift mask blank of this Example, a phase shift mask was manufactured in the same manner as in Example 2. In this Example, a conductive mask film pattern is not removed during dry etching of a light-shielding film. Therefore, upon completion of dry etching of the light-shielding film, an etching mask film pattern and the conductive mask film pattern are formed on a surface of a formed light-shielding film pattern.

The CD linearity of a phase shift film pattern in the obtained phase shift mask of this Example was 3 nm and thus fully satisfied the value of CD linearity required for a photomask in the semiconductor design rule of DRAM half-pitch 32 nm. Further, the CD uniformity was also fully satisfied. A mask blank was produced in the same manner as in Example 3 except that the thickness of a conductive mask film was set to 2 nm and the thickness of an etching mask film was set to 5 nm. Then, a photomask was produced using this mask blank. As a result, the CD linearity was less than 5 nm and thus fully satisfied the value of CD linearity required for a photomask in the semiconductor design rule of DRAM half-pitch 32 nm. Further, the CD uniformity was also fully satisfied.

EXAMPLE 4

A phase shift mask blank of this Example was produced in the same manner as in Example 2 except that an etching mask film of SiON formed in the following manner was used instead of the etching mask film of MoSiON in the phase shift mask blank of Example 2.

Using a Si target as a sputtering target, reactive sputtering at a power of 1.8 kW was carried out in a mixed gas atmosphere of argon, nitrogen monoxide, and helium (Ar: 8 sccm, NO: 29 sccm, He: 32 sccm), thereby forming an etching mask film of SiON having a thickness of 15 nm.

Using the obtained phase shift mask blank of this Example, a phase shift mask was manufactured in the same manner as in Example 2.

The CD linearity of a phase shift film pattern in the obtained phase shift mask of this Example was 3 nm and thus fully satisfied the value of CD linearity required for a photomask in the semiconductor design rule of DRAM half-pitch 32 nm. Further, the CD uniformity was also fully satisfied. As carried out in Example 1, mask blanks and photomasks were produced in the same manner as in Example 4 except changing the material of the conductive mask film. In any of the photomasks, a light-shielding film pattern with an excellent CD linearity of 3 nm to 4 nm was obtained. Further, mask blanks were produced in the same manner as in Example 4 except that conductive mask films were made of the above-mentioned materials, respectively, the thickness of each conductive mask film was set to 2 nm, and the thickness of each etching mask film was set to 5 nm. Then, photomasks were produced using these mask blanks, respectively. In any of the photomasks, the CD linearity was less than 5 nm and thus fully satisfied the value of CD linearity required for a photomask in the semiconductor design rule of DRAM half-pitch 32 nm. Further, the CD uniformity was also fully satisfied in any of the photomasks.

EXAMPLE 5

Using a DC magnetron sputtering apparatus and using a mixed target of Mo and Si (the content of Mo to the total content of Mo and Si is 4%) as a sputtering target, reactive sputtering was carried out in a mixed gas atmosphere of argon, nitrogen, oxygen, and helium (Ar: 11.5 sccm, $N_2$: 50 sccm, $O_2$: 8.1 sccm, He: 100 sccm), thereby forming a phase shift film of MoSiON having a thickness of 74 nm on a light-transmissive substrate of quartz glass. This phase shift film was such that the transmittance was 20% and the phase shift amount was 177.4o for ArF excimer laser light (wavelength: 193 nm).

Then, using the DC magnetron sputtering apparatus and using a chromium target as a sputtering target, reactive sputtering at a power of 1.8 kW was carried out in a mixed gas atmosphere of argon, carbon dioxide, nitrogen, and helium (Ar: 18 sccm, $CO_2$: 18.8 sccm, $N_2$: 10 sccm, He: 32 sccm), thereby forming a back-surface antireflection layer of CrOCN having a thickness of 28 nm on the phase shift film.

Then, using the chromium target, reactive sputtering at a power of 1.71 kW was carried out in a mixed gas atmosphere of argon, nitrogen monoxide, and helium (Ar: 13 sccm, NO: 11.1 sccm, He: 32 sccm), thereby forming a light-shielding layer of CrON having a thickness of 7 nm. Then, using the chromium target, reactive sputtering at a power of 1.8 kW was carried out in a mixed gas atmosphere of argon, nitrogen, carbon dioxide, and helium (Ar: 18 sccm, $N_2$: 10 sccm, $CO_2$: 18.8 sccm, He: 32 sccm), thereby forming an antireflection layer of CrOCN having a thickness of 15 nm. In this manner, a light-shielding film composed of the back-surface antireflection layer, the light-shielding layer, and the antireflection layer and having a total thickness of 50 nm was formed.

Then, like in Example 2, an etching mask film of MoSiON having a thickness of 12 nm and a conductive mask film of MoN having a thickness of 3 nm were formed in this order on the light-shielding film.

In the laminated structure of the phase shift film and the light-shielding film (the back-surface antireflection layer, the light-shielding layer, and the antireflection layer) formed as described above, the reflectance for ArF excimer laser light (wavelength: 193 nm) was 18.8% and there was an antireflection function to suppress reflection of returning light from the back surface side of the light-transmissive substrate. Further, in the laminated structure of the phase shift film and the light-shielding film, the optical density (OD) for ArF excimer laser light (wavelength: 193 nm) was 3.0.

In this manner, a halftone phase shift mask blank of this Example was produced.

Then, using the obtained phase shift mask blank of this Example, a phase shift mask was manufactured in the same manner as in Example 2.

The CD linearity of a phase shift film pattern in the obtained phase shift mask of this Example was 3 nm and thus fully satisfied the value of CD linearity required for a photomask in the semiconductor design rule of DRAM half-pitch 32 nm. Further, the CD uniformity was also fully satisfied. As carried out in Example 1, mask blanks and photomasks were produced in the same manner as in Example 5 except changing the material of the conductive mask film. In any of the photomasks, a light-shielding film pattern with an excellent CD linearity of 3 nm to 4 nm was obtained. Further, mask blanks were produced in the same manner as in Example 5 except that conductive mask films were made of the above-mentioned materials, respectively, the thickness of each conductive mask film was set to 2 nm, and the thickness of each etching mask film was set to 5 nm. Then, photomasks were produced using these mask blanks, respectively. In any of the photomasks, the CD linearity was less than 5 nm and thus fully satisfied the value of CD linearity required for a photomask in the semiconductor design rule of DRAM half-pitch 32 nm. Further, the CD uniformity was also fully satisfied in any of the photomasks.

Comparative Example 1

Using an in-line type DC magnetron sputtering apparatus, a light-shielding film composed of a back-surface antireflection layer and a surface layer (a layer serving as both a light-shielding layer and an antireflection layer) and having a total thickness of 73 nm was formed on a light-transmissive substrate of quartz glass by continuous film formation.

First, using a chromium target as a sputtering target, reactive sputtering at a power of 1.7 kW was carried out in a mixed gas atmosphere of argon and nitrogen (Ar: 72 sccm, $N_2$: 28 sccm), thereby forming a back-surface antireflection layer of CrN.

Then, using the chromium target, reactive sputtering at a power of 1.7 kW was carried out in a mixed gas atmosphere of a mixed gas of argon and methane, nitrogen monoxide, and helium (Ar+$CH_4$: 105 sccm, NO: 3 sccm, He: 40 sccm), thereby forming a surface layer of a two-layer structure having a CrCN layer as a lower layer and a CrON layer as an upper layer.

Then, using a mixed target of Mo and Si (the content of Mo to the total content of Mo and Si is 9.5%) as a sputtering target, reactive sputtering at a power of 1.8 kW was carried out in a mixed gas atmosphere of argon, nitrogen monoxide, and helium (Ar: 8 sccm, NO: 29 sccm, He: 32 sccm), thereby forming an etching mask film of MoSiON having a thickness of 15 nm.

In the light-shielding film in the form of the laminate of the back-surface antireflection layer and the surface layer formed as described above, the reflectance for ArF excimer laser light (wavelength: 193 nm) was 19.8% and the optical density (OD) for ArF excimer laser light (wavelength: 193 nm) was 3.0.

In this manner, a binary mask blank of this Comparative Example was produced.

Then, using the obtained binary mask blank of this Comparative Example, a photomask was manufactured in the same manner as in Example 1.

The CD linearity of a light-shielding film pattern in the obtained photomask of this Comparative Example was 7 nm and thus did not satisfy the value of CD linearity required for a photomask in the semiconductor design rule of DRAM half-pitch 32 nm. Further, with respect to the CD uniformity, variation is large and thus the required value was not satisfied.

Comparative Example 2

Using a DC magnetron sputtering apparatus and using a mixed target of Mo and Si (the content of Mo to the total content of Mo and Si is 9.5%) as a sputtering target, reactive sputtering at a power of 2.8 kW was carried out in a mixed gas atmosphere of argon, nitrogen, and helium (Ar: 9 sccm, $N_2$: 81 sccm, He: 76 sccm), thereby forming a phase shift film of MoSiN having a thickness of 69 nm on a light-transmissive substrate of quartz glass. This phase shift film was such that the transmittance was 6% and the phase shift amount was approximately 180o for ArF excimer laser light (wavelength: 193 nm).

Then, using an in-line type DC magnetron sputtering apparatus, a light-shielding film composed of a back-surface antireflection layer and a surface layer (a layer serving as both a light-shielding layer and an antireflection layer) and having a total thickness of 59 nm was formed on the phase shift film by continuous film formation.

First, using a chromium target as a sputtering target, reactive sputtering at a power of 1.7 kW was carried out in a mixed gas atmosphere of argon and nitrogen (Ar: 72 sccm, $N_2$: 28 sccm), thereby forming a back-surface antireflection layer of CrN.

Then, using the chromium target, reactive sputtering at a power of 1.7 kW was carried out in a mixed gas atmosphere of a mixed gas of argon and methane, nitrogen monoxide, and helium (Ar+$CH_4$: 95 sccm, NO: 5 sccm, He: 40 sccm), thereby forming a surface layer of a two-layer structure having a CrCN layer as a lower layer and a CrON layer as an upper layer.

Then, using a mixed target of Mo and Si (the content of Mo to the total content of Mo and Si is 9.5%) as a sputtering target, reactive sputtering at a power of 1.8 kW was carried out in a mixed gas atmosphere of argon, nitrogen monoxide, and helium (Ar: 8 sccm, NO: 29 sccm, He: 32 sccm), thereby forming an etching mask film of MoSiON having a thickness of 12 nm.

In the laminated structure of the phase shift film and the light-shielding film (the back-surface antireflection layer and the surface layer) formed as described above, the optical density (OD) for ArF excimer laser light (wavelength: 193 nm) was 3.1.

In this manner, a halftone phase shift mask blank of this Comparative Example was produced.

Then, using the obtained phase shift mask blank of this Comparative Example, a phase shift mask was manufactured in the same manner as in Example 2.

The CD linearity of a phase shift film pattern in the obtained phase shift mask of this Comparative Example was 6 nm and thus did not satisfy the value of CD linearity required for a photomask in the semiconductor design rule of DRAM half-pitch 32 nm. Further, with respect to the CD uniformity, variation is large and thus the required value was not satisfied.

What is claimed is:

1. A mask blank comprising:
   a light-transmissive substrate;
   a light-shielding film formed on an upper surface of a light-transmissive substrate and made of a material mainly containing chromium; and
   a hard mask film consisting of a laminated film formed on said light-shielding film; wherein said hard mask film comprises:
   an etching mask film made of a material including silicon and dry-etchable with fluorine-based gas; and
   a conductive mask film formed on an upper surface of said etching mask film and made of a conductive material which contains a main material different from silicon and is dry-etchable with a fluorine-based gas.

2. The mask blank according to claim 1, wherein said conductive mask film is made of said conductive material containing one or more components among molybdenum, titanium, vanadium, niobium, and tungsten or containing the one or more components and nitrogen added thereto.

3. The mask blank according to claim 2, wherein said conductive material is selected from a group consisting of MoN, TiN, VN, NbN, WN, Mo, Ti, V and Nb.

4. The mask blank according to claim 1, wherein said conductive mask film made of a conductive material which is dry-etchable with not only a fluorine-based gas but also a chlorine gas.

5. The mask blank according to claim 1, wherein said etching mask film serves as an antireflection film.

6. The mask blank according to claim 1, wherein said conductive mask film has a thickness of 2 nm to 20 nm.

7. The mask blank according to claim 1, wherein said laminated film of said etching mask film and said conductive mask film has a thickness of 7 nm to 32 nm.

8. The mask blank according to claim 1, wherein said etching mask film made of a material including at least one of nitrogen and oxygen along with silicon.

9. The mask blank according to claim 1, wherein said etching mask film made of a material selected from a group consisting of SiN, SiON, MoSi and MoSiON.

10. The mask blank according to claim 1, wherein the mask blank further comprises a resist film for electron beam writing which is formed on an upper surface of said conductive mask film and has a thickness of 50 nm to 300 nm.

11. The mask blank according to claim 1, wherein the mask blank further comprises a phase shift film between said light-transmissive substrate and said light-shielding film.

12. The mask blank according to claim 11, wherein said conductive mask film is made of said conductive material containing one or more components among tantalum, molybdenum, titanium, vanadium, niobium, and tungsten or containing the one or more components and nitrogen added thereto.

13. The mask blank according to claim 12, wherein said conductive material is selected from a group consisting of TaN, MoN, TiN, VN, NbN, WN, Ta, Mo, Ti, V and Nb.

14. The mask blank according to claim 11, wherein said phase shift film is made of a material containing one of an oxide, an nitride and an oxynitride of molybdenum silicide.

15. The mask blank according to claim 11, wherein said light-shielding film includes an antireflection function layer at a surface layer portion thereof.

16. The mask blank according to claim 15, wherein said antireflection function layer made of a material selected from a group consisting of CrON, CrO, CrCO, and CrCON.

* * * * *